United States Patent [19]

Iwamoto et al.

[11] Patent Number: 5,731,727
[45] Date of Patent: Mar. 24, 1998

[54] VOLTAGE CONTROL TYPE DELAY CIRCUIT AND INTERNAL CLOCK GENERATION CIRCUIT USING THE SAME

[75] Inventors: Hisashi Iwamoto; Yasuhiro Konishi, both of Hyogo, Japan

[73] Assignee: Mitsubishi Denki Kabushiki Kaisha, Tokyo, Japan

[21] Appl. No.: 527,968

[22] Filed: Sep. 14, 1995

[30] Foreign Application Priority Data

Nov. 1, 1994 [JP] Japan .................. 6-268683

[51] Int. Cl.$^6$ .................. H03K 5/14; H03L 1/00
[52] U.S. Cl. .................. 327/281; 327/158; 327/262; 327/535; 327/276; 331/57
[58] Field of Search .................. 331/57, 109, 175, 331/176; 327/262, 276, 277, 278, 281, 285, 288, 378, 548, 362, 270, 149, 153, 158, 161, 534, 546, 537, 535; 323/315, 316

[56] References Cited

U.S. PATENT DOCUMENTS

| | | | |
|---|---|---|---|
| 4,806,804 | 2/1989 | O'Leary | 327/281 |
| 4,853,654 | 8/1989 | Sakurai | 331/176 |
| 4,891,609 | 1/1990 | Eilley | 331/57 |
| 5,059,838 | 10/1991 | Motegi et al. | 327/534 |
| 5,072,197 | 12/1991 | Anderson | 331/57 |
| 5,081,428 | 1/1992 | Atriss et al. | 331/57 |
| 5,164,621 | 11/1992 | Miyamoto | 327/262 |
| 5,331,295 | 7/1994 | Jelinek et al. | 331/57 |
| 5,428,310 | 6/1995 | Casper et al. | 327/262 |
| 5,446,418 | 8/1995 | Hara et al. | 331/57 |
| 5,459,423 | 10/1995 | Nozawa et al. | 327/281 |
| 5,544,120 | 8/1996 | Kuwagata et al. | 331/176 |

OTHER PUBLICATIONS

"6.255 Pull-in Range Digital PLL for ISDN Primary Rate Interface LSI" Kondoh et al., VLSI 1991; pp. 73-74.

*Primary Examiner*—Timothy P. Callahan
*Assistant Examiner*—Eunja Shin
*Attorney, Agent, or Firm*—Lowe, Price, LeBlanc & Becker

[57] ABSTRACT

A control transistor is connected in parallel with an input transistor of a bias generation circuit in a voltage control delay circuit. A power supply potential Vcc is divided by voltage divider resistors to be applied to the gate of the control transistor. Reduction in the power supply potential Vcc causes reduction in a current Ib flowing to the control transistor, and a current Ic=Ia+Ib flowing to a delay time variable element. When the power supply potential Vcc is reduced, the factor of a delay time period of delay time variable elements becoming shorter due to a smaller amplitude of a clock signal is canceled with the factor of the delay time period of the delay time variable elements become longer due to a smaller current Ic flowing thereto. Therefore, variation in the delay time period can be suppressed to a low level.

16 Claims, 12 Drawing Sheets

VOLTAGE CONTROL TYPE DELAY CIRCUIT AND INTERNAL CLOCK GENERATION CIRCUIT USING THE SAME

BACKGROUND OF THE INVENTION

1. Field of the Invention

The present invention relates to a voltage control type delay circuit, and an internal clock generation circuit using the same. More particularly, the present invention relates to a voltage control type delay circuit for delaying an input signal by a time period according to a control voltage and providing the delayed signal, and an internal clock generation circuit for generating an internal clock signal in synchronization with an external clock signal.

2. Description of the Background Art

Although the rate of a dynamic random access memory (referred to as DRAM hereinafter) used as a main memory is increased, the operation rate thereof does not still yet followed that of a microprocessor (referred to as MPU hereinafter). It is well known that the overall performance of a system is degraded due to the bottleneck of the access time and the cycle time of the DRAM. Usage of a synchronous type DRAM (referred to as SDRAM hereinafter) that operates in synchronization with a clock signal as the main memory for high speed MPUs is proposed. An SDRAM will be described hereinafter.

FIG. 3 is a block diagram showing a structure of the main parts of a conventional SDRAM. In FIG. 3, the functional portion relating to input and output of 1-bit data in an SDRAM of a ×8 bit organization is shown. An array portion associated with a data input/output terminal DQi includes a memory array 1a forming a bank #1 and a memory array 1b forming a bank #2.

With respect to memory array 1a of bank #1, there are provided an X decoder group 2a including a plurality of row decoders for decoding address signals X0–Xj to select a corresponding row in memory array 1a, a y decoder group 4a including a plurality of column decoders for decoding column address signals Y3–Yk to generate a column select signal selecting a corresponding column in memory array 1a, and a sense amplifier group 6a for detecting and amplifying data of a memory cell connected to a selected row in memory array 1.

X decoder group 2a includes a row decoder provided corresponding to each word line in memory array 1a. A corresponding row decoder is selected according to address signals X0–Xj, and a word line provided corresponding to a selected row decoder attains a selected state.

Y decoder group 4a includes a column decoder provided corresponding to each column select lines of memory array 1a. One column select line renders 8 pairs of bit lines to a selected state. 8 bits of memory cells are simultaneously selected in memory array 1a by X decoder group 2a and Y decoder group 4a. X decoder 2a and Y decoder group 4a are shown to be activated by bank specify signal B1.

Furthermore, a bus GIO of an internal data transmission line (global IO line) for transmitting data detected and amplified by sense amplifier group 6a and transmitting write data to a selected memory cell in memory array 1a are provided. Global IO line bus GIO includes eight pairs of global IO lines for data exchange simultaneous to the eight bits of memory cells selected at the same time.

For the purpose of data readout, there are provided a preamplifier group 8a activated in response to a preamplifier activation signal φPA1 for amplifying data on global IO line bus GIO in bank #1, a register 10a for storing data amplified by preamplifier group 8a which are to be read out, and an output buffer 12a for sequentially providing data stored in read register 10a.

Preamplifier group 8a and read register 10a each have a structure of 8 bits in width corresponding to the eight pairs of global IO lines. Read register 10a responds to a register activation signal φRr1 to latch data provided from preamplifier group 8a which are sequentially output.

Output buffer 12a responds to an output enable signal φOE1 to transmit the 8 bits of data sequentially provided from read register 10a to a data input/output terminal DQi. FIG. 3 shows data input and output carried out via data input/output terminal DQi. A structure may be employed in which data input and output is carried out by individual terminals.

For the purpose of writing data, there are provided a 1-bit width input buffer 18a activated in response to an input buffer activation signal φDB1 for generating internal write data from data applied to data input/output terminal DQi, a register 16a activated in response to a register activation signal φRw1 for sequentially storing (according to wrap address) write data transmitted from input buffer 18a, and a write buffer group 14a activated in response to a write buffer activation signal φWB1 for amplifying data stored in write register 16a and transmitting the amplified data to global IO line bus GIO.

Write buffer group 14a and write register 16a each have a width of 8 bits.

Similarly, bank #2 includes a memory array 1b, an X decoder group 2b, a Y decoder group 4b, a sense amplifier group 6b activated in response to a sense amplifier activation signal φSA2, a preamplifier group 8b activated in response to a preamplifier activation signal φPA2, a read register 10b activated in response to a register activation signal φRr2, an output buffer 12b activated in response to an output enable signal φOE2, a write buffer group 14b activated in response to a buffer activation signal φWB2, a write register 16b activated in response to a register activation signal φRw2, and an input buffer 18b activated in response to a buffer activation signal φDB2.

The structure of bank #1 is equal to that of bank #2. The provision of read registers 10a and 10b and write registers 16a and 16b allows data input/output in synchronization with a high speed clock signal with respect to one data input/output terminal DQi.

As to each control signal for banks #1 and #2, only a control signal with respect to one of the two banks is generated according to bank specify signals B1 and B2.

Functional block 200 shown in FIG. 3 is provided for each data input/output terminal. In the case of an SDRAM of a ×8 bit organization, there are eight functional blocks 200.

By activating one of banks #1 and #2 of substantially equal structure by bank specify signals B1 and B2, banks #1 and #2 can operate independent of each other.

The individual provision of data readout registers 10a and 10b and data write registers 16a and 16b for each of banks #1 and #2 allows proper data readout and writing with no collision in data when switching the data readout and writing operation mode and when switching the bank.

A first control signal generation circuit 20, a second control signal generation circuit 22, and a clock counter 23 are provided as the control system for driving each of banks #1 and #2 independently.

First control signal generation circuit 20 receives an externally applied control signal, i.e., an external row address strobe signal ext./RAS, an external column address strobe signal ext./CAS, an external output enable signal ext./OE, an external write enable signal (write permitting signal) ext./WE, and a mask specify signal WM in synchronization with an external clock signal CLK which is, for example, a system clock, for generating internal control signals φxa, φya, φW, φO, φR and φC.

Second control signal generation circuit 2 responds to bank specify signals B1 and B2, internal control signals φW, φO, φR and φC, and clock signal CLK to generate a control signal for driving bank #1 and #2 individually, i.e., sense amplifier activation signals φSA1, φSA2, preamplifier activation signals φPA1, φPA2, write buffer activation signals φWB1, φWB2, input buffer activation signals φDB1, φDB2 and output buffer activation signals φOE1, φOE2.

Thus, as peripheral circuitry, the SDRAM further includes an X address buffer 24 responsive to internal control signal φXA for entering external address signals ext./A0 to ext./Ai for generating internal address signals X0–Xj and bank select signals B1 and B2, an Y address buffer 26 activated in response to internal control signal φya for generating column select signals Y3–Yk specifying a column select line, wrap address bits Y0–Y2 for specifying the first bit line pair (column) in a continuous access operation, and bank specify signals B1 and B2, and a register control circuit 28 for generating wrap addresses WY0–WY7, register driving signals φRr1 and φRr2 for controlling read registers 10a and 10b, and control signals φRw1 and φRw2 for driving write registers 16a and 16b.

Register control circuit 28 also receives bank specify signals B1 and B2 to generate a register drive signal with respect to a selected bank.

FIG. 4 is a timing chart showing the state of an external signal when reading or writing 8 bits of data continuously (8×8=64 bits) in the above-described SDRAM.

In the SDRAM, an external control signal (row address strobe signal/RAS, column address signal/CAS, address signal Add, etc.) is entered at a rising edge of an external clock signal CLK which is, for example, a system clock. Address signal Add includes a row address signal X and a column address signal Y multiplexed in a time divisional manner.

A data readout operation will first be described.

At a rising edge of clock signal CLK at cycle 1, row address strobe signal/RAS attaining an L level of an active state and column address strobe signal/CAS and write enable signal/WE attaining an H level causes the current address signal Add to be received as row address signal X.

At a rising edge of clock signal CLK at cycle 4, column address strobe signal/CAS attaining an L level of an active state causes the current address signal Add to be received as column address Y. A row and column select operation is implemented in the SDRAM according to the entered row address signal Xa and column address Yb. At an elapse of a predetermined clock period (6 clock cycles in FIG. 4) from a fall of row address strobe signal/RAS to an L level, the first data b0 is output. Data b1–b7 are output thereafter in response to a fall of clock signal CLK.

In a writing operation, entry of row address signal Xc is similar to that of data readout. More specifically, when row address strobe signal/RAS attains an L level of an active state and column address strobe signal/CAS and write enable signal/WE attain an H level at a rising edge of clock signal CLK at cycle 16, the current address signal Add is entered as column address signal Xc. When column address strobe signal/CAS and write enable signal WE both attain an L level of an active state at a rising edge of clock signal CLK at cycle 19, column address signal Yd is entered, and data d0 applied at that time is entered as the first write data. A row and column select operation is executed in the SDRAM in response to a falling edge of signals/RAS and/CAS. Input data d1–d7 are sequentially input in synchronization with clock signal CLK, and the input data is sequentially written into a memory cell.

As described above, the SDRAM enters signals/RAS, CAS, an address, and data at a rising edge of clock signal CLK to operate. Therefore, the cycle time can be improved since it is not necessary to ensure margin for data input/ output due to a skew (timing offset) of an address in contrast to a conventional DRAM that operates in response to entering an address and data in synchronization with signals/ RAS,/CAS, etc. Some systems frequently access a plurality of continuous bits. By improving the continuous access time, the average access time can be made equal to that of a static random access memory (SRAM).

It is to be noted that the access time from clock signal CLK must be reduced in order to further improve the operation rate. Incorporation of a delay lock loop (referred to as DLL hereinafter) circuit in a chip is proposed to carry out data input/output in response to a generated internal clock signal int.CLK having a rising phase ahead that of external clock signal ext/CLK.

FIG. 5 is a block diagram showing a structure of a conventional DLL circuit. Referring to FIG. 5, the DLL circuit includes clock buffers 31 and 36, a phase comparator 32, a charge pump 33, a loop filter 34 and a voltage control delay circuit 35.

Clock buffer 31 includes M (M is a positive integer) inverters 31.1–31.M connected in series to amplify external clock signal ext.CLK for providing a clock signal ECLK as shown in FIG. 6. Clock signal ECLK is applied to phase comparator 32 and voltage control delay circuit 35. The size of the symbols of inverters 31.1–31.M represent the level of the load driving capability of each of inverters 31.1–31.M. The level of the load driving capability of inverters 31.1–31.M gradually increases towards the output end. Inverters 31.6–31.M of the succeeding stage is set to have a load driving capability approximately 3 to 4 times that of a preceding stage of inverters 31.1–31.M-1. The number of M of inverters 31.1–31.M is set according to the capacity of phase comparator 32 and voltage control delay circuit 35.

As shown in FIG. 7, clock buffers 36 includes N (N is a positive integer) inverters 36.1–36.N connected in series to amplify an output ECLK' of voltage control delay circuit 35 to provide internal clock signal int.CLK and clock signal RCLK. As described above, internal clock signal int.CLK is supplied to the SDRAM. Clock signal RCLK is provided to phase comparator 32. Similar to clock buffer 31, the load driving capability of inverters 36.1–36.N forming clock buffer 36 gradually increases towards the output. The number of N of inverters 36.1–36.N is set according to the level of the load capacitance. The inverter providing clock signal RCLK (inverter 36.4 in the figure) is selected so that the phase difference between external clock signal ext. CLK and internal clock signal int.CLK is a predetermined value.

Phase comparator 32 of FIG. 5 will be described with reference to FIG. 8. Referring to FIG. 8, phase comparator 32 includes inverters 40–44, 2-input NAND gates 45–50, 3-input NAND gates 51 and 52, and a 4-input NAND gate 53.

Inverter 40 receives clock signal ECLK from clock buffer 31. Inverter 41 receives clock signal RCLK from clock buffer 36. NAND gate 45 receives outputs of inverter 40 and NAND gate 51 to provide a signal φ1. NAND gate 46 receive outputs of NAND gates 45 and 47 to provide a signal φ2. NAND gate 47 receives outputs of NAND gates 46 and 53, and NAND gate 48 receives outputs of NAND gates 49 and 53. NAND gate 49 receives outputs of NAND gates 48 and 50 to provide a signal φ3. NAND gate 50 receives outputs of inverter 41 and NAND gate 52 to output a signal φ4.

NAND gate 53 receives signals φ1–φ4 from NAND gates 45, 46, 49, and 50, respectively, to provide a reset signal RES. NAND gate 51 receives signals φ1, φ2, and RES from NAND gates 45, 46, and 53, respectively, to provide an up signal UP via inverters 42 and 43. NAND gate 52 receives signals φ3, φ4 and RES from NAND gates 49, 50, and 53, respectively, to provide a down signal DOWN via inverter 44.

FIG. 9 is a timing chart showing the relationship of clock signal ECLK, clock signal RCLK, output of 2-input NAND gate 45 (signal φ1), output of 2-input NAND gate 50 (signal φ4), output of 4-input NAND gate 53 (reset signal RES), up signal/UP, and down signal DOWN.

Prior to the description of FIGS. 8 and 9, a case is considered where clock signals ECLK and RCLK both attain an H level. In this case, gates 45 and 50 both provide a signal of an H level. If the outputs of gates 46 and 49 attain an H level, the output of gate 53 is pulled down to an L level, and outputs of gates 47 and 48 are pulled up to an H level, whereby outputs of gates 46 and 49 are pulled down to an L level. It is therefore appreciated that gates 51 and 52 always provides signals of an H level as long as clock signals ECLK and RCLK both attain an H level. When clock signals CLK and RCLK are then driven to an L level, outputs of gates 45 and 50 are pulled down to an L level, whereby gates 46 and 49 provide signals of an H level.

A case where clock signal ECLK is pulled up, and then clock signal RCLK is pulled up with a delay of phase T1 will be described as shown in FIG. 9. In response to a rise of clock signal ECLK, the output of gate 45 is driven to an H level. However, the output of gate 50 maintains the L level since clock signal RCLK still attains an L level, and the output level of H of gate 53 does not change. Therefore, the output of gate 51 is pulled down to an L level. In contrast, the output of gate 52 is maintained at the H level.

Then, when clock signal RCLK rises, the output of gate 50 is driven to an H level, whereby all the 4 inputs of gate 53 are pulled up to an H level, and the output of gate 53 is pulled down to an L level. As a result, the output of gate 51 is pulled up again to an H level from the L level, and gate 51 provides a pulse signal reflecting the phase difference between clock signals ECLK and RCLK. Although the output of gate 52 is driven to an L level in response to the change of the output of gate 50 to an H level, the change of the output of gate 53 to an L level right after causes the output of gate 50 to return to H level immediately. Therefore, gate 52 provides a pulse signal of a constant width regardless of the phase difference between clock signals ECLK and RCLK.

The description of the case where clock signal ECLK rises after the rise of clock signal RCLK is similar provided that the relationship of up signal/UP and down signal DOWN is reversed.

Thus, a phase comparator 32 provides up signal/UP of a constant pulse width and down signal DOWN of a pulse width according to a phase difference when the phase of clock signal ECLK is behind that of clock signal RCLK, an up signal/UP and a down signal DOWN of the same pulse width when the phase of clock signal ECLK matches that of clock signal RCLK, and a down signal DOWN of a constant pulse width and an up signal/UP of a pulse width according to a phase difference when the phase of clock signal ECLK is ahead that of clock signal RCLK.

FIG. 11 is a circuit diagram showing a structure of charge pump 33 and loop filter 34 of FIG. 5. Referring to FIG. 11, charge pump 33 includes a constant current source 63, a P channel MOS transistor 64, an N channel MOS transistor 65, and a constant current source 66 connected in series between a power supply line 61 and a ground potential line 62. The gates of P channel MOS transistor 64 and N channel MOS transistor 65 receive up signal/UP and down signal DOWN, respectively. A node N64 between P channel MOS transistor 64 and N channel MOS transistor 65 is the output node of charge pump 33. Loop filter 34 includes a resistor 67 and a capacitor 68 connected in series between output node N64 of charge pump 33 and ground potential line 62.

The operation of charge pump 33 and loop filter 34 of FIG. 11 will be described hereinafter. When up signal/UP and down signal DOWN both attain an L level, P channel MOS transistor 64 is rendered conductive and N channel MOS transistor 65 is rendered non-conductive, whereby charge is supplied to capacitor 68 via power supply potential line 61→ constant current source→ P channel MOS transistor 64→ node N64→ resistor 67. The voltage of node N64, i.e. control voltage VCOin, gradually increases.

When up signal/UP and down signal DOWN both attain an H level, P channel MOS transistor 64 is rendered non-conductive and P channel MOS transistor 65 is rendered conductive. Charge of capacitor 64 flows out via a path of capacitor 68→ resistor 67→ node N64→ N channel MOS transistor 65→ constant current source 66→ ground potential line 62. As a result, control voltage VCOin is gradually reduced.

When up signal/UP attains an L level and down signal DOWN attains an H level, MOS transistors 64 and 65 are both rendered conductive. The amount of charge flowing into node 64 and the amount of charge flowing out from node 64 equal each other. Therefore, there is no change in control voltage VCOin.

When up signal/UP attains an H level and down signal DOWN attains an L level, MOS transistors 64 and 65 are both rendered non-conductive. Therefore, node N64 attains a floating state, so that there is no change in control voltage VCOin.

Control voltage VCOin which is the output of charge pump 33 and loop filter 34 is gradually reduced when the phase of clock signal ECLK is behind that of clock signal RCLK, does not change when the phase of clock signal CLK matches that of clock signal RCLK, and gradually is increased when the phase of clock signal ECLK is ahead that of clock signal RCLK.

FIG. 12 is a circuit diagram of a structure of voltage control delay circuit 35 of FIG. 5 with a portion thereof omitted. Referring to FIG. 12, voltage control delay circuit 35 includes a bias generation circuit 70, and K (K is a positive integer) delay time variable elements 80.1–80.K connected in series.

Bias generation circuit 70 includes P channel MOS transistors 71 and 72, and N channel MOS transistors 73 and 74. P channel MOS transistor 71 and N channel MOS transistor 73 are connected in series between power supply potential line 61 and ground potential line 62. P channel MOS transistor 72 and N channel MOS transistor 74 are connected in series between power supply potential line 61 and ground potential line 62. P channel MOS transistors 71 and 72 have their gates connected in common and also to the drain of P channel MOS transistor 71. More specifically, P channel MOS transistors 71 and 72 form a current mirror circuit. N channel MOS transistor 73 receives control voltage VCOin at its gate. N channel MOS transistor 74 has its gate connected to the drain thereof.

A current Ia increasing/decreasing according to control voltage VCOin flows through N channel MOS transistor 73. The same current Ia flows in the four MOS transistors 71–74 since MOS transistor 73 and 71 are connected in series, MOS transistors 71 and 72 form a current mirror circuit, and MOS transistors 72 and 74 are connected in series. It is assumed that the size of MOS transistors 71 and 72 are equal.

Delay time variable element 80.1 includes P channel MOS transistors 80.1 and 82.1 and N channel MOS transistors 83.1 and 84.1 connected in series between power supply potential line 61 and ground potential line 62. P channel MOS transistor 80.1 has its gate connected to the gate of P channel MOS transistor 72 of bias generation circuit 70. MOS transistors 82.1 and 83.1 have their gates connected in common. MOS transistors 82.1 and 83.1 form an inverter 80.1a. N channel MOS transistor 84.1 has its gate connected to the gate of N channel MOS transistor 74 of bias generation circuit 70. The structure of the other delay time variable elements 80.2–80.K is similar. Inverters 80.1a–80.Ka are connected in series. Inverter 80.1a receives clock signal ECLK, and inverter 80.Ka provides a clock signal ECLK'.

The operation of voltage control delay circuit 35 of FIG. 12 will be described hereinafter. Since P channel MOS transistors 81.1–81.81K have their gates connected to the gate of P channel MOS transistor 72, and N channel MOS transistors 84.1–84.K have their gates connected to the gate of N channel MOS transistor 74, current Ia according to control voltage VCOin flows into each of delay time variable element 80.1–80.K.

Increase of current Ia in response to a higher control voltage VCOin causes reduction in the inverting time period of 1 of each of inverters 80.1a–80.Ka. Therefore, the delay time of voltage control delay circuit 35 is reduced.

Reduction of current Ia in response to a lower control voltage VCOin increases the inverting time period of each of inverters 80.1a–80.Ka to increase the delay time of voltage control delay circuit 35.

The operation of the DLL circuit of FIG. 5 will be described. When the phase of clock signal RCLK is behind that of clock signal ECLK, phase comparator 32 provides up signal/UP of a pulse width corresponding to the phase difference between clock signals ECLK and RCLK, and a down signal DOWN of a predetermined pulse width. In response, charge pump 33 supplies charge to loop filter 34, whereby control voltage VCOin increases. As a result, the delay time of voltage control delay circuit 35 is reduced. Therefore, the phase of clock signal RCLK is advanced, and the phase difference between clock signals CLK and RCLK is reduced.

When the phase of clock signal RCLK is ahead that of clock signal ECLK, phase comparator 32 provides down signal DOWN of a pulse width according to the phase difference between clock signals RCLK and CLK, and up signal/UP of a predetermined pulse width. In response, charge flows from loop filter 34 to charge pump 33, whereby control voltage VCOin is decreased. As a result, the delay time period of voltage control delay circuit 35 is increased. Therefore, the phase of clock signal RCLK is delayed, and the phase difference between clock signals RCLK and ECLK is reduced.

By repeating the above-described process, the phase of clock signal RCLK finally matches that of clock signal ECLK. Here, as shown in FIG. 13, an internal clock signal int.CLK having a phase ahead that of external signal ext.CLK by a phase of a desired value is provided from clock buffer 36.

Although the conventional DLL circuit can follow the power source noise where power supply potential Vcc changes mildly, there was a disadvantage that noise where power supply potential VCC suddenly changes from several ten nsec. to several hundred nsec cannot be traced.

A case where power supply potential Vcc is suddenly reduced will be described. Since there is no immediate change in control voltage VCOin even when power supply voltage Vcc is lowered, the current flowing through inverters 80.1a–80.Ka of voltage control delay circuit 35 does not change. However, reduction in power supply potential Vcc causes reduction in the amplitude of clock signals ECLk, ECLK' and RCLK, so that the inverting time period of inverters 80.1a–80.Ka becomes shorter. Therefore, the delay time of voltage control delay 35 is reduced.

Since reduction in power supply potential Vcc causes reduction in the driving capability of the inverter forming clock buffers 31 and 36, the delay time period of clock buffers 31 and 36 is increased.

Therefore, the phase of clock signals ECLK and RCLK will not match each other as long as the change in the delay time period of voltage control delay circuit 33 does not cancel the change of the delay time period of clock buffers 31 and 36. This means that the DLL circuit is out of a synchronous state.

In the above-described SDRAM, a great amount of current flows during an operation of a sense amplifier. A power supply noise is generated where power supply voltage Vcc changes at several ten nsec. If a conventional DLL circuit is mounted in an SDRAM, the DLL circuit will be out of synchronization at the time of operation of a sense amplifier, and the operation of the SDRAM becomes unstable.

SUMMARY OF THE INVENTION

In view of the foregoing, an object of the present invention is to provide a voltage control type delay circuit that has the delay time period increased or decreased according to a change in power supply voltage.

Another object of the present invention is to provide an internal clock generation circuit that does not deviate from a synchronous state even when power supply voltage changes.

A first voltage control type delay circuit according to an aspect of the present invention includes a first transistor for conducting a current according to a control voltage, a second transistor connected in series with the first transistor, a current control circuit for altering a current flowing to the second transistor according to a change in a power supply voltage, and a delay circuit for delaying an input signal by a time period according to a current flowing to the second transistor. The delay time is increased or decreased according to change in the power supply voltage.

The current control circuit includes a third transistor connected in parallel with the first transistor for conducting a current Ib according to the power supply voltage, and a first voltage-down circuit for down-converting the power supply voltage and providing the voltage to the third transistor. Therefore, a current Ic=Ia+Ib which is current Ia flowing through the first transistor according to a control voltage added with current Ib flowing to the third transistor can be conducted to the second transistor. When the power supply voltage is down-converted, the control current Ic of the delay circuit can be reduced to increase the delay time period.

Preferably, the first voltage-down circuit includes first and second voltage divider resistors. As a result, the first voltage-down circuit can easily be formed.

The current control circuit includes a fourth transistor connected in parallel with the second transistor and conducting a current Id according to the power supply voltage, and a second voltage-down circuit for down-converting the power supply voltage and supplying the voltage to the fourth transistor. As a result, a current Ie=Ia−Id can be conducted to the second transistor which is current Id flowing to the fourth transistors subtracted from current Ia flowing to the first transistor according to the control voltage. When the power supply voltage is reduced, control current Ie of the delay circuit can be increased to reduce the delay time period.

Preferably, the second voltage-down circuit includes third and fourth voltage divider resistors. As a result, the second voltage-down circuit can easily be formed.

Preferably, the delay circuit includes a plurality of delay time variable elements having each delay time period varied according to a current flowing to the second transistor. As a result, the delay circuit can easily be formed.

A second voltage control type delay circuit according to another aspect of the present invention includes a first transistor for conducting a current according to a control voltage, a second transistor connected in series with the first transistor, a third transistor forming a current mirror circuit with the second transistor, a fourth transistor connected in series with the third transistor, a current control circuit for altering the current flowing to the second transistor according to a change in the power supply voltage, and a delay circuit for delaying an input signal by a time period according to the current flowing to the fourth transistor. The delay time period can be increased or decreased according to the power supply voltage.

The current control circuit includes a fifth transistor connected in parallel with the first transistor for conducting a current Ib according to the power supply voltage, and a first voltage-down circuit for down-converting the power supply voltage and supplying the voltage to the fifth transistor. As a result, a current Ic=Ia+Ib can be conducted to the second, third, and fourth transistors which is current Ia flowing to the first transistor according to a control voltage added with current Ib flowing to the fifth transistor. When the power supply voltage is reduced, the control current Ic of the delay circuit can be reduced to increase the delay time period.

Preferably, the first voltage-down circuit includes first and second voltage divider resistors. As a result, the first voltage-down circuit can easily be formed.

The current control circuit includes a tenth transistor connected in parallel with the second transistor for conducting a current Id according to the power supply voltage, and a second voltage-down circuit for down-converting the power supply voltage and supplying the same to the tenth transistor. A current Ie=Ia−Id can be conducted to the second, third and fourth transistors which is current Id flowing to the tenth transistor subtracted from current Ia flowing to the first transistor according to control voltage. When the power supply voltage is reduced, control current Ie of the delay circuit can be increased to reduce the delay time period.

Preferably, the second voltage-down circuit includes third and fourth voltage divider resistors. As a result the second voltage-down circuit can easily be formed.

Preferably, a delay time variable element of the delay circuit includes sixth to ninth transistors connected in series between a power supply potential line and a ground potential line. The sixth and ninth transistors form a current mirror circuit together with the third and fourth transistors respectively. The seventh and eighth transistors form an inverter. As a result, the delay circuit is easily formed.

An internal clock generation circuit according to an aspect of the present invention includes a control voltage generation circuit for providing a control voltage according to the phase difference between an external clock signal and an internal clock signal, and the above first voltage control type delay circuit receiving a control voltage. Therefore, the delay time period of the delay circuit is increased or decreased according to a change in the power supply voltage. A change in the delay time period of a circuit other than the delay circuit by a change in the power supply voltage can be canceled by a change in the delay time period of the delay circuit. Therefore, the internal clock generation circuit can be prevented from being offset from a synchronous state attributable to a change in the power supply voltage.

An internal clock generation circuit according to another aspect of the present invention includes a control voltage generation circuit for providing a control voltage according to a phase difference between an external clock signal and an internal clock signal, and the above second voltage control type delay circuit receiving the control voltage. Similar to the above first internal clock generation circuit, offset from a synchronous state can be prevented due to a change in the power supply voltage.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
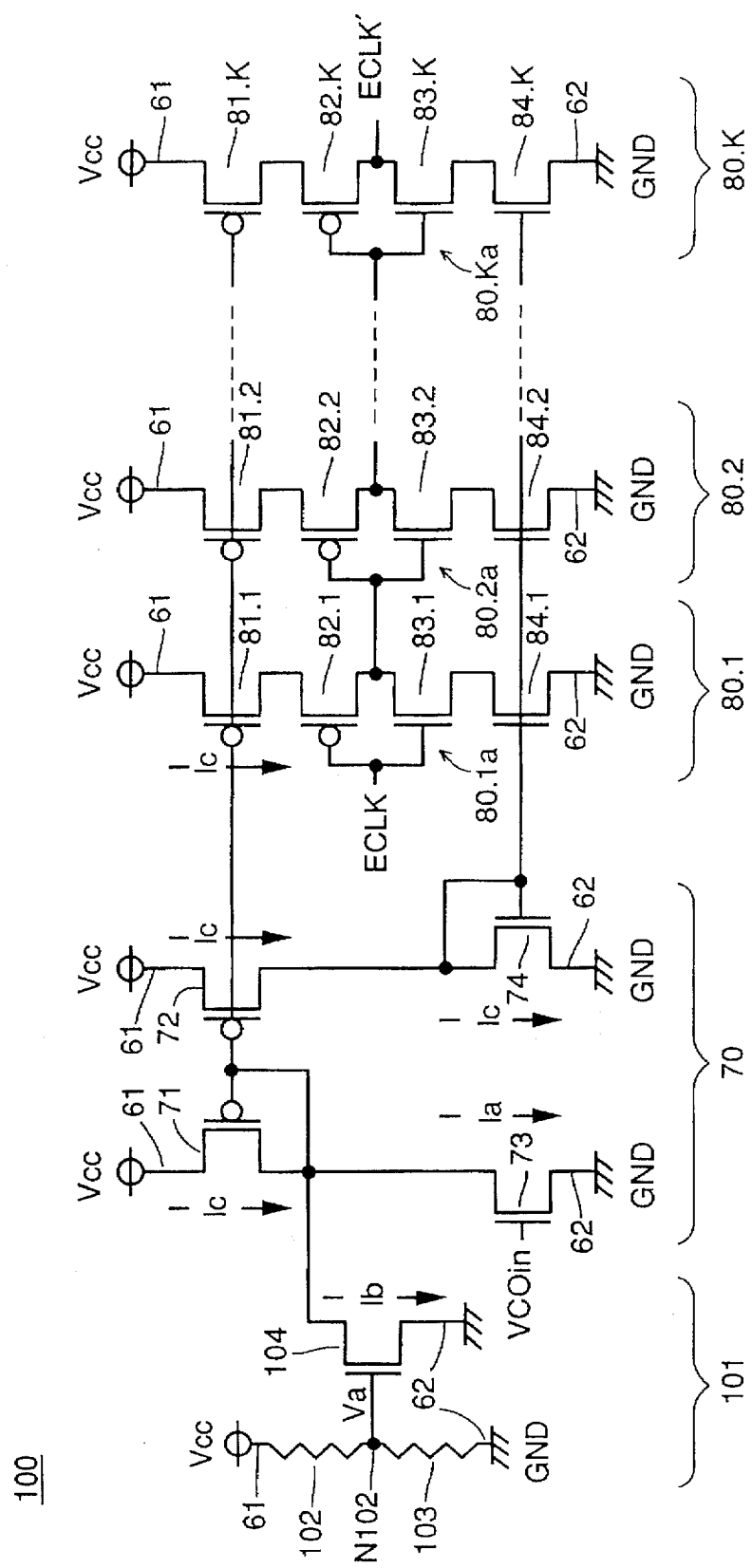
FIGS. 1 and 2 are circuit diagrams showing a structure of a voltage control delay circuit of an DLL circuit according to a first and second embodiments, respectively, of the present invention with a portion thereof omitted.
Figure 12:
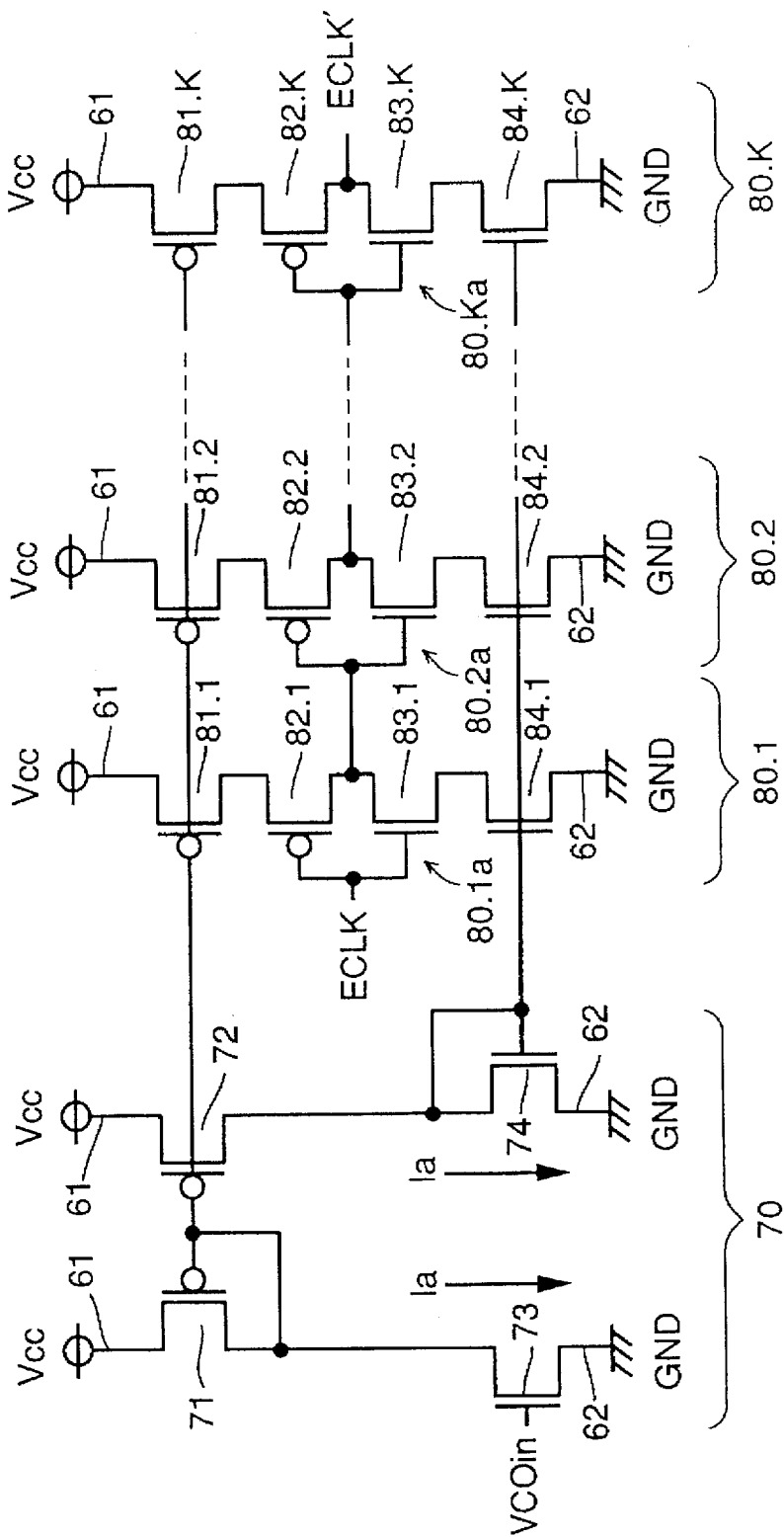
FIG. 12 is a circuit diagram showing a structure of the voltage control delay circuit of the DLL circuit of FIG. 5 with a portion thereof omitted.
Figure 13:
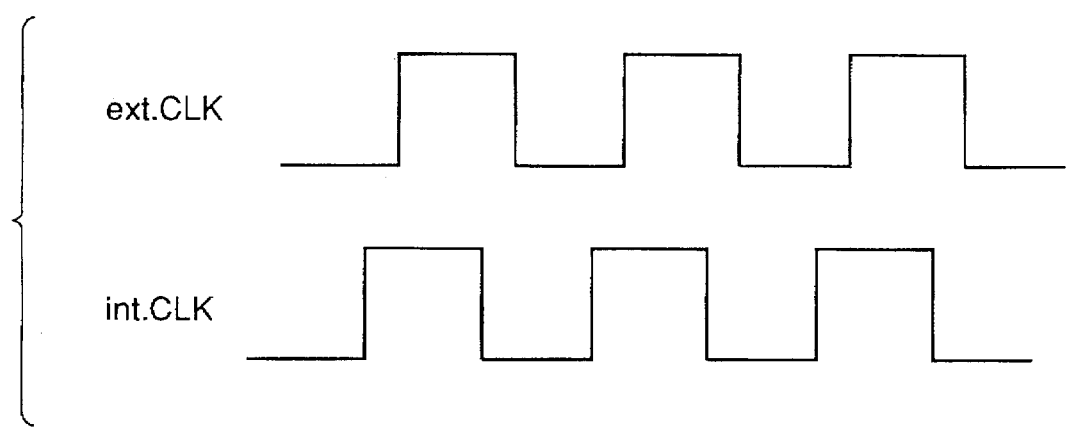
FIG. 13 is a timing chart showing an operation of the DLL circuit of FIG. 5.

Referring to FIG. 1, a voltage control delay circuit 100 of the present embodiment differs from voltage control delay 35 of FIG. 12 in that a current control circuit 101 is additionally provided.

Current control circuit 101 includes voltage divider resistors 102 and 103, and an N channel MOS transistor 104. Voltage divider resistors 102 and 103 are connected in series between a power supply potential line 61 and a ground potential line 62. N channel MOS transistor 104 is connected in parallel with N channel MOS transistor 73. N channel MOS transistor 102 has its gate connected to a node N102 of voltage divider resistors 102 and 103.

Drain current $I_D$ of the MOS transistor operating in a saturation region is typically represented by the following equation:

$$I_D \propto (V_{SG} - Vth)^2$$

where $V_{SG}$ is the gate-source voltage, and Vth is the threshold voltage of the MOS transistor.

Current Ia flowing to MOS transistor 73 is proportional to $(VCOin-Vth)^2$, and current Ib flowing to MOS transistor 104 is proportional to $(Va-Vth)^2$ Here, Va is the potential of node N102. Current Ic flowing to MOS transistor 71 is the sum of Ia and Ib (Ic=Ia+Ib). Current Ic is mirrored to flow into delay time variable elements 80.1–80.K.

The operation of power supply voltage Vcc of the SDRAM being reduced due to an operation of sense amplifier or the like will be described hereinafter. Since charge pump 33 and loop filter 34 do not respond immediately to reduction of power supply potential Vcc, control voltage VCOin does not change and current Ia flowing to MOS transistor 73 will not change. Therefore, if the newly added MOS transistor 104 is not provided, current Ia is directly mirrored by delay time variable elements 80.1–80.K. Therefore, the current flowing to delay time variable elements 80.1–80.K will not change even when there is change in power supply potential Vcc. However, reduction of power supply potential Vcc causes the amplitude of a clock signal transmitted by delay time variable elements 80.1–80.K to become smaller. Therefore, the delay time period of delay time variable elements 80.1–80.K is shortened.

In contrast, voltage control delay circuit 100 of the present embodiment has gate voltage Va of MOS transistor 104 reduced according to a fall in power supply potential Vcc, so that current Ib flowing to MOS transistor 104 is reduced. Also, since current Ic flowing to MOS transistor 71 is the sum of Ia and Ib (Ic=Ia+Ib), reduction of power supply potential Vcc causes current Ic flowing to MOS transistor 71 to be reduced. Furthermore, since current Ic is mirrored by delay time variable elements 80.1–80.K, current Ic flowing thereto is reduced. When power supply potential Vcc is reduced, the factor of decrease in the delay time period of delay time variable elements 80.1–80.K due to a smaller amplitude of clock signal and the factor of increase in the delay time period of delay time variable elements 80.1–80K due to a smaller current flowing to delay time variable elements 80.1–80.K cancel each other. Therefore, variation in the delay time period of voltage control delay circuit 100 is suppressed to a small level regardless of change in power supply potential Vcc. Therefore, the SDRAM can operate stably.

Second Embodiment

Figure 6:
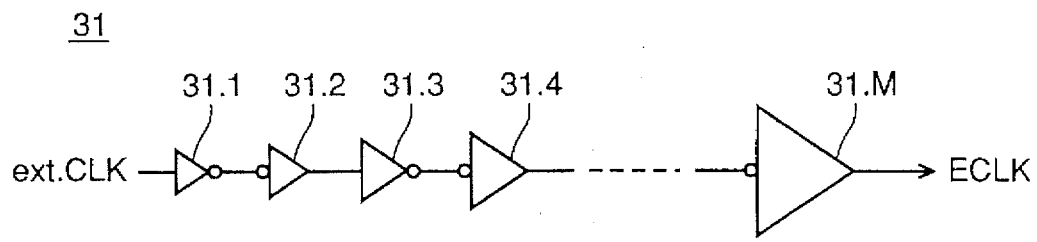
FIGS. 6 and 7 are circuit diagrams of clock buffers 31 and 36, respectively, of the DLL circuit of FIG. 5 with a portion thereof omitted.
Figure 7:
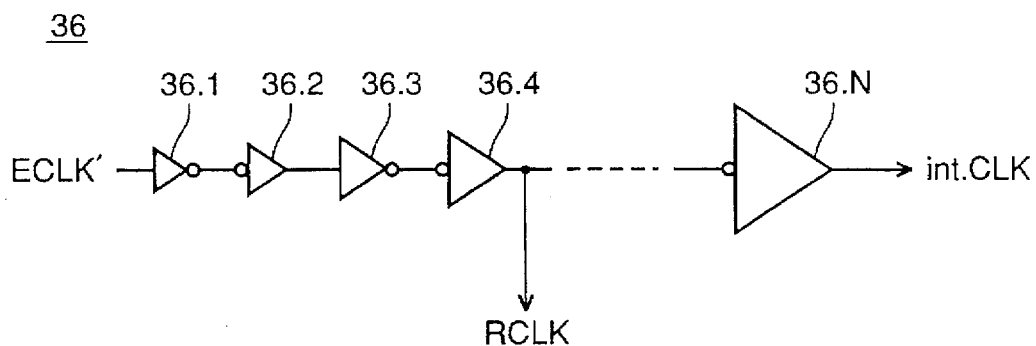
Figure 8:
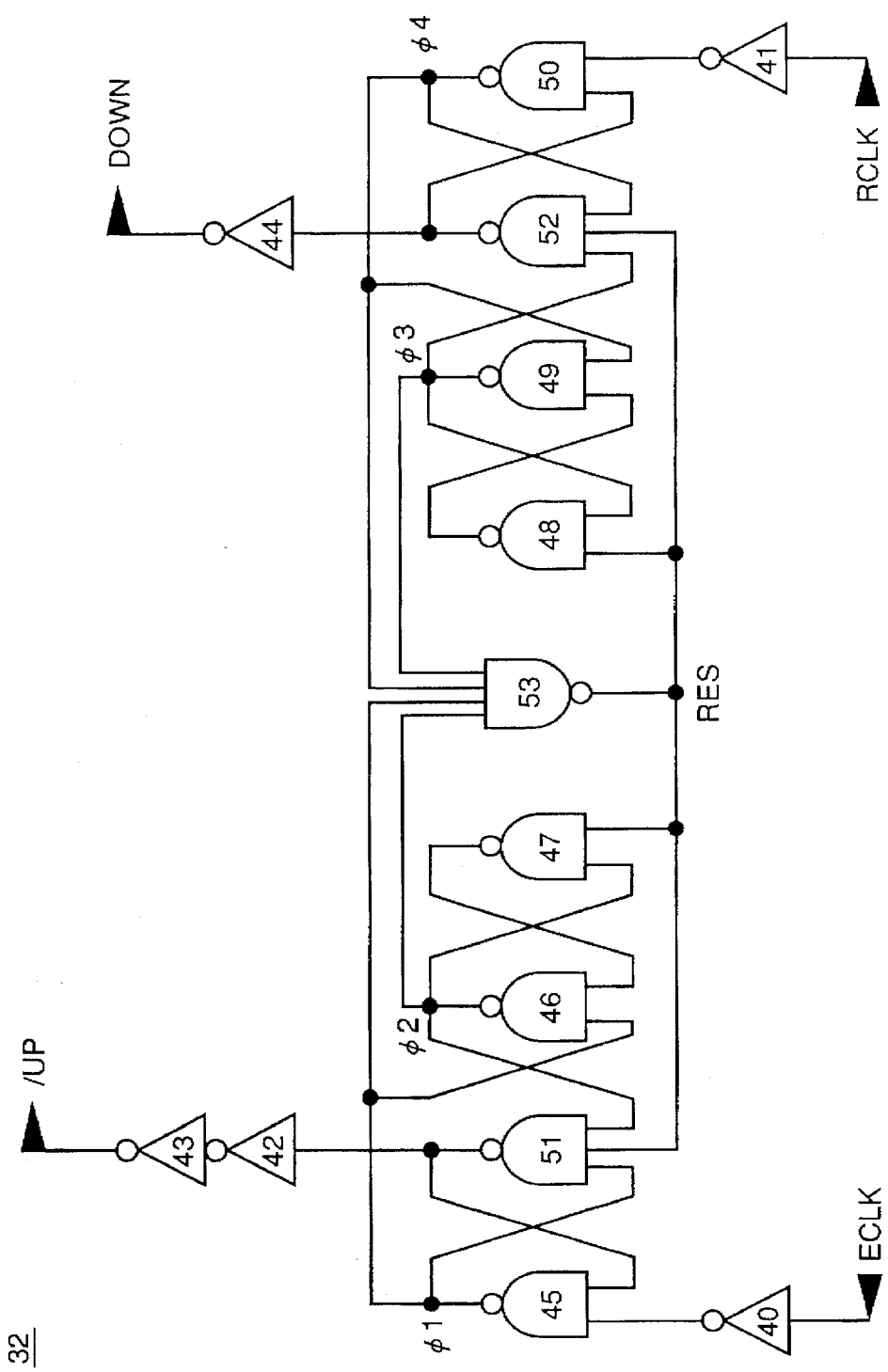
FIG. 8 is a circuit diagram showing a structure of a phase comparator of the DLL circuit of FIG. 5.
Figure 9:
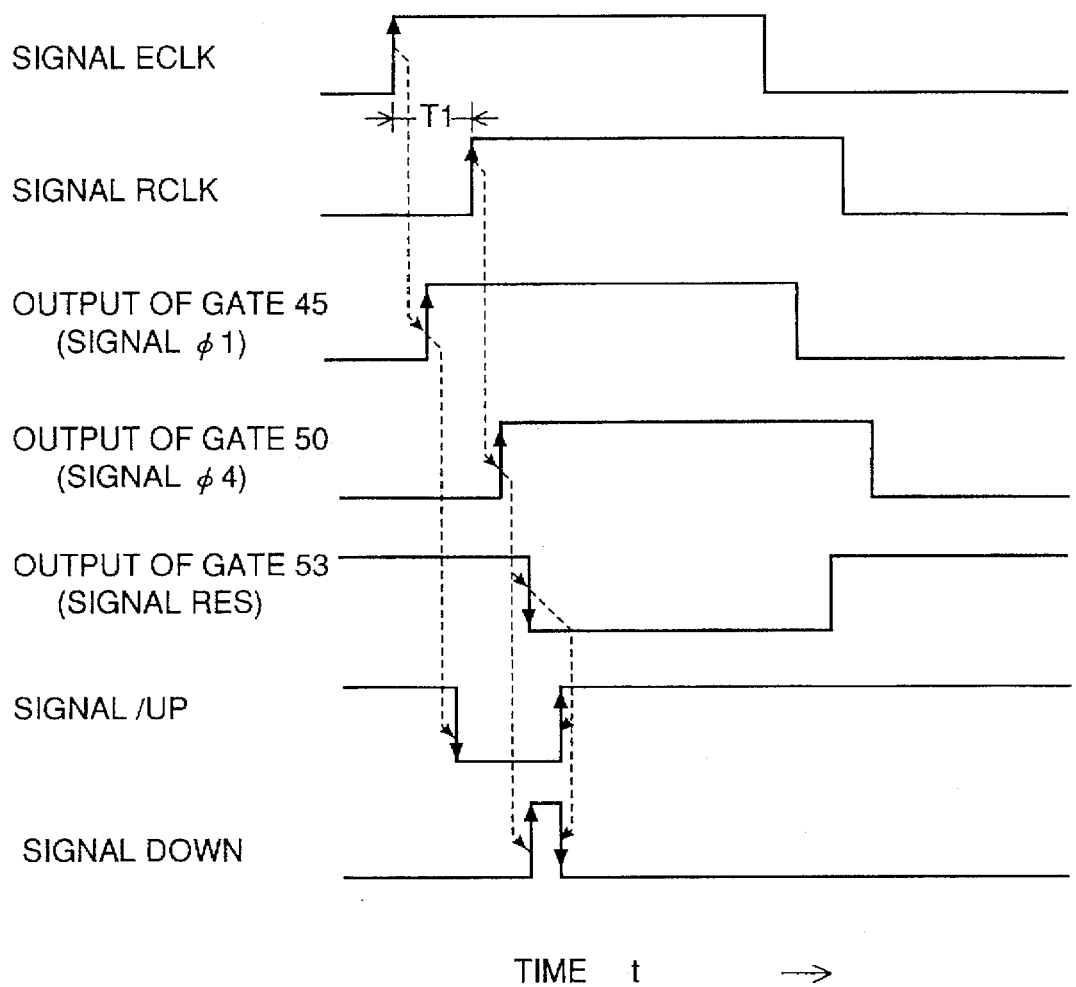
FIGS. 9 and 10 are timing charts showing an operation of the phase comparator of FIG. 8.
Figure 10:
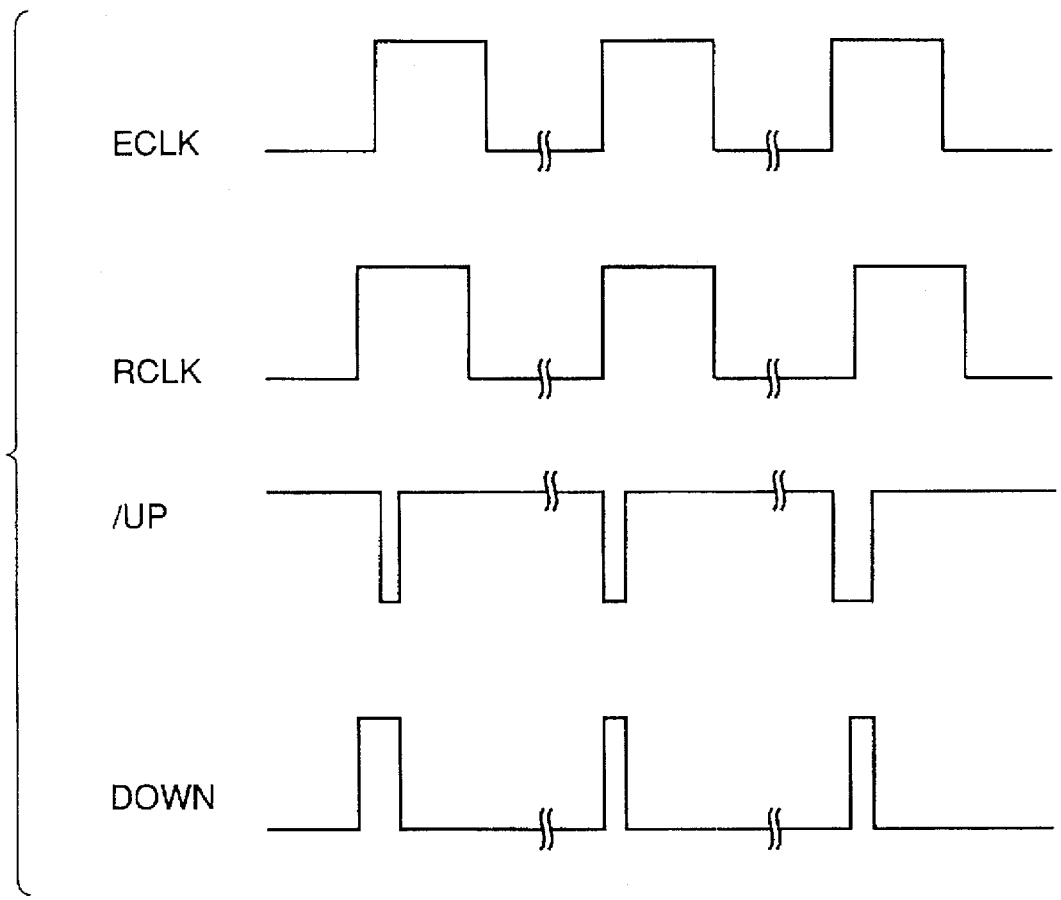
Figure 11:
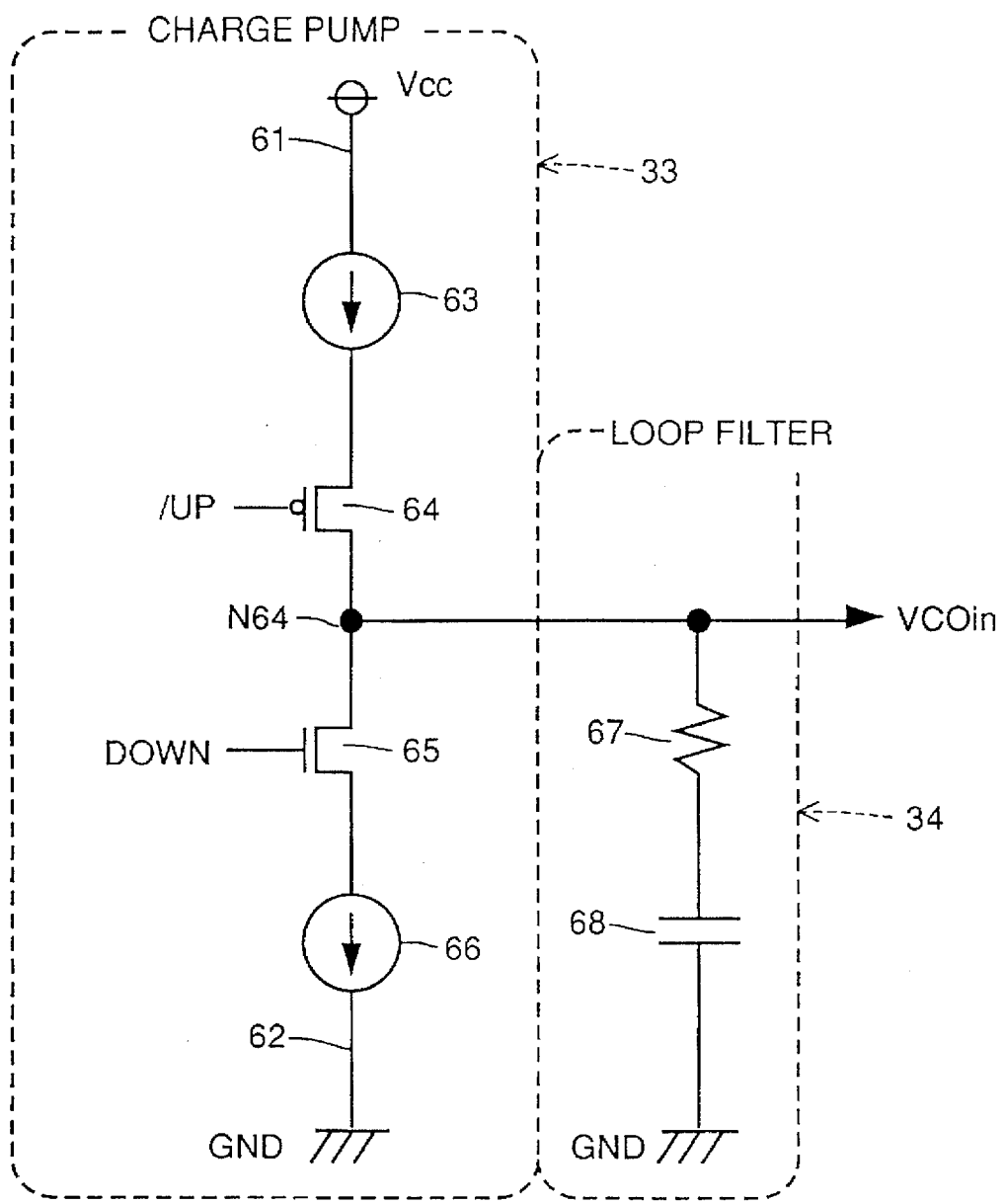
FIG. 11 is a circuit diagram showing a structure of the charge pump and the loop filter of the DLL circuit of FIG. 5

When delay of a clock signal is considered totally of a DLL circuit, it is also necessary to account for the delay period of, not only voltage control delay circuit 35, but also clock buffers 31 and 36. As shown in FIGS. 6 and 7, clock buffers 31 and 36 are formed of a plurality of inverters connected in series. Therefore, a change in power supply potential Vcc causes a change in the delay time period of clock buffers 31 and 36. For example, a reduction in power supply potential Vcc causes reduction in the driving capability of the inverter forming clock buffers 31 and 36 to increase the delay time period thereof. Since the delay time period of the entire DLL circuit is the sum of voltage control delay circuit 35 and clock buffers 31 and 36, there is a possibility that the delay time period is increased when power supply potential Vcc becomes lower. In this case, the delay time period of voltage control delay circuit 35 must be shortened. In the present embodiment, a voltage control delay circuit 110 is implemented that can reduce the delay time period when there is a drop in power supply potential Vcc.

Figure 2:
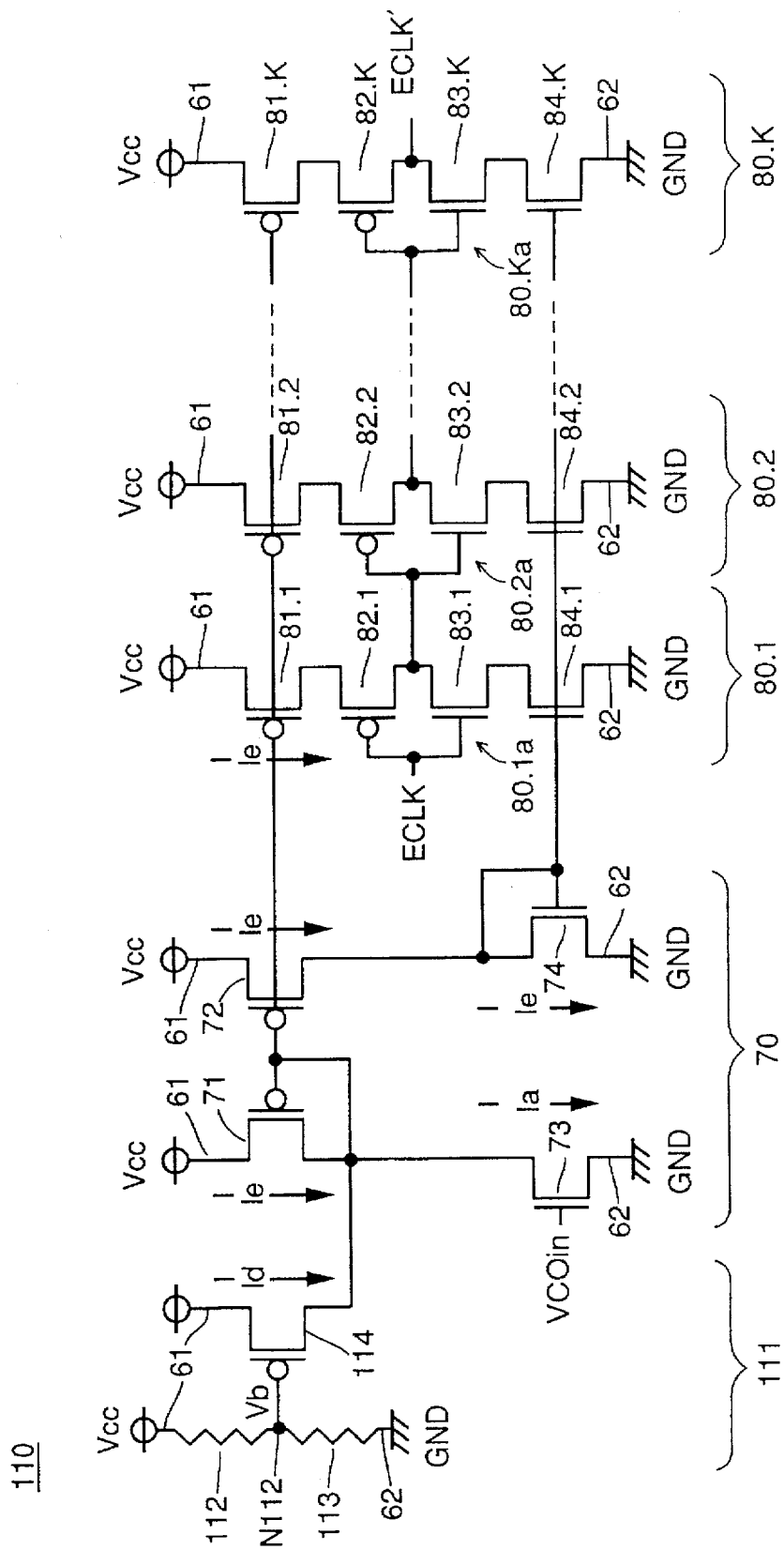
Figure 3:
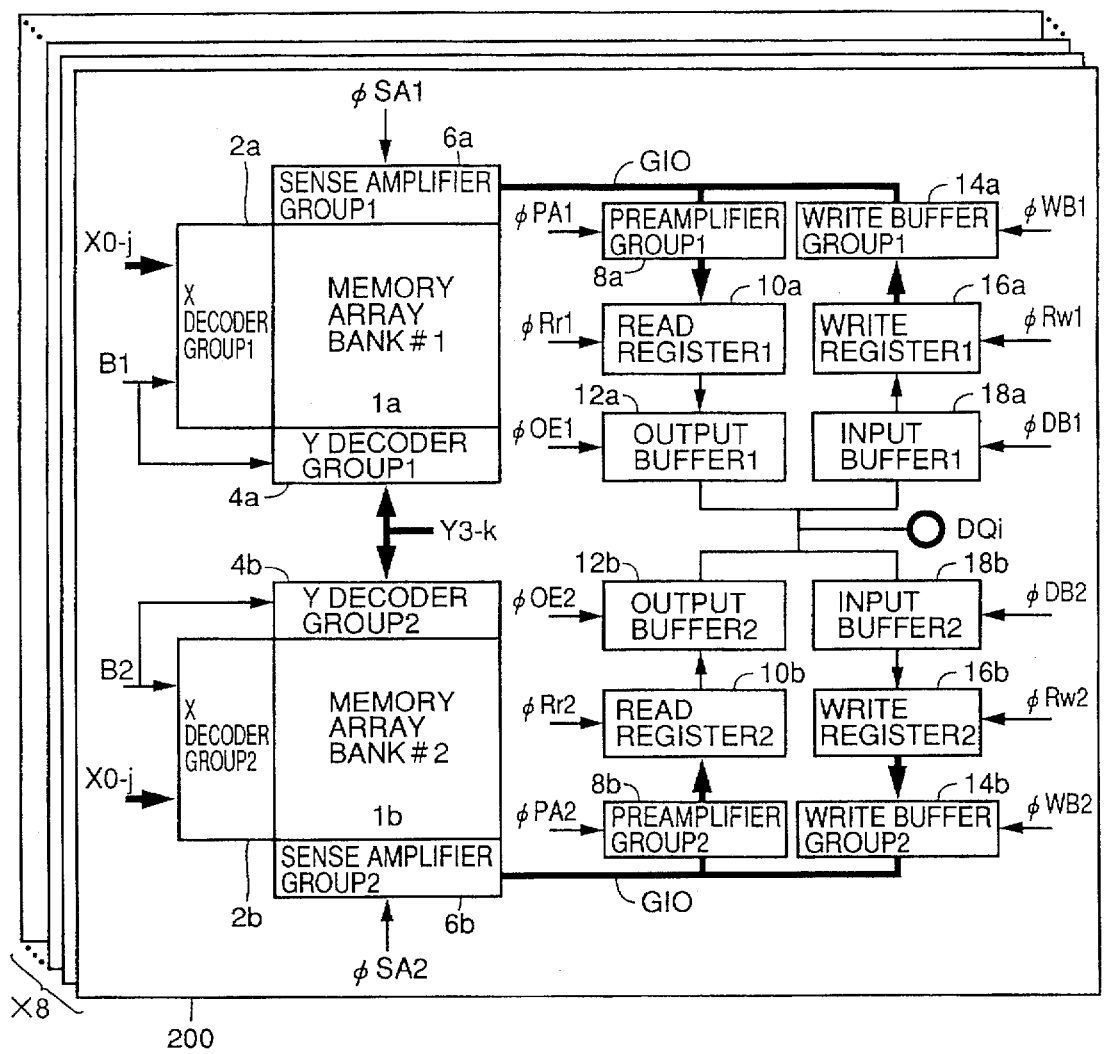
FIG. 3 is a block diagram showing a function of a structure of the main parts of a conventional SDRAM.
Figure 3:
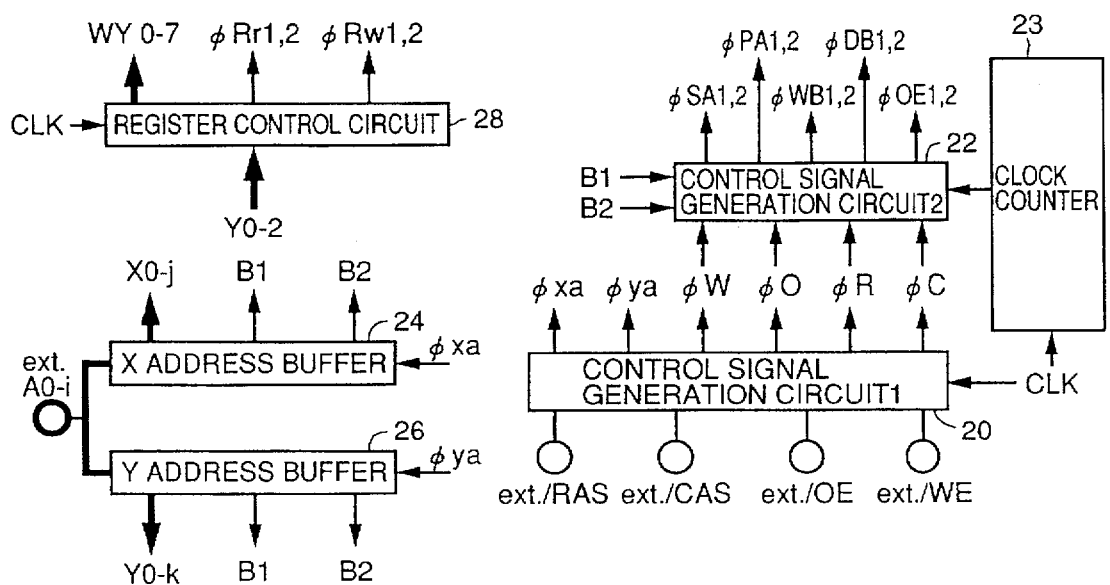
Figure 4:
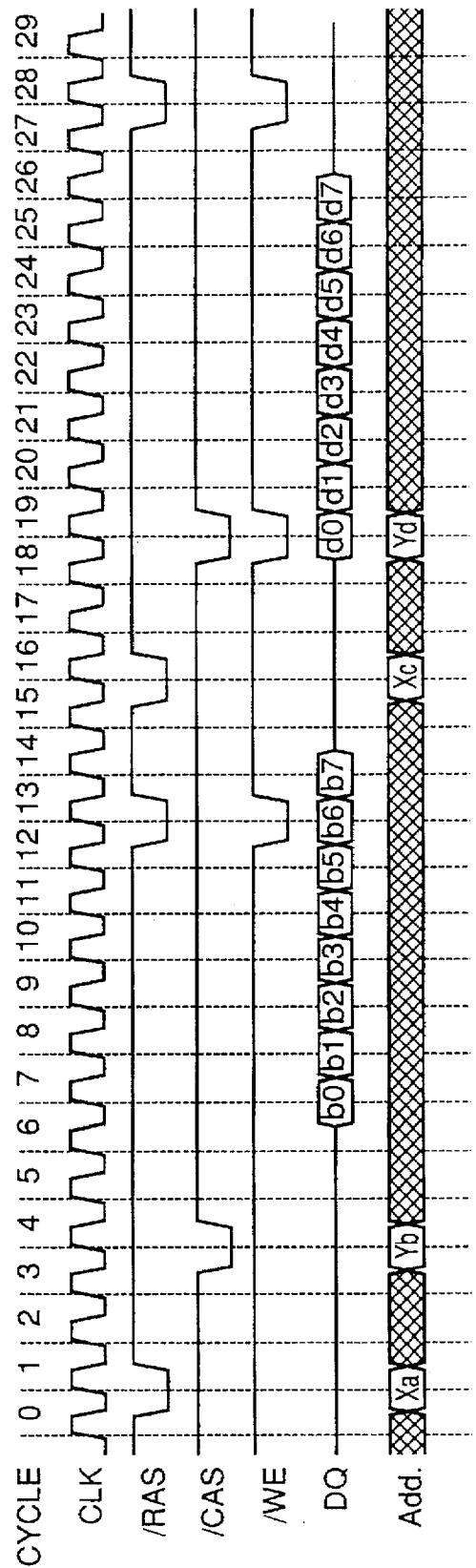
FIG. 4 is a timing chart showing an operation of the SDRAM of FIG. 3.
Figure 5:
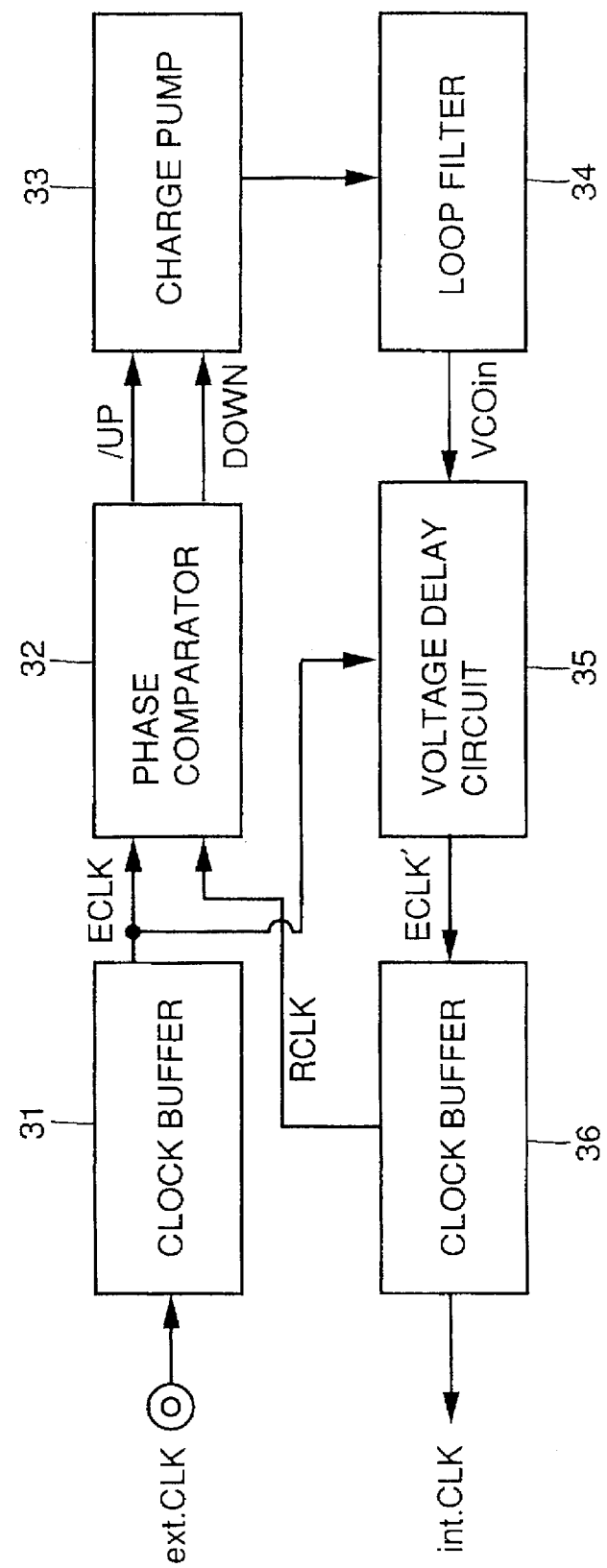
FIG. 5 is a block diagram showing a structure of a conventional DLL circuit.

FIG. 2 shows a structure of voltage control delay circuit 110 of a DLL circuit according to a second embodiment of the present invention. Referring to FIG. 2, voltage control delay circuit 110 differs from voltage control delay circuit 35 of FIG. 12 in that a current control circuit 111 is newly provided.

Voltage control circuit 111 includes voltage divider resistors 111 and 113, and P channel MOS transistor 114. Voltage divider resistors 112 and 113 are connected in series between power supply potential line 61 and ground potential line 62. P channel MOS transistor 114 is connected in parallel with N channel MOS transistor 71. P channel MOS transistor 114 has its gate connected to a node N112 of voltage divider resistors 112 and 113.

Current Ia flowing to MOS transistor 73 is proportional to $(VCOin-Vth)^2$. Current Id flowing to MOS transistor 114 is proportional to $(Vcc-Vb-Vth)^2$. Vb is the potential of node N112. Current Ie flowing to MOS transistor 71 is the difference between Ia and Id (Ie=Ia-Id). Current Ie is mirrored to flow into delay time variable elements 80.1–80.K.

The operation when power supply potential Vcc is reduced due to an operation of sense amplifier or the like will be described hereinafter. Since charge pump 33 and loop filter 34 do not respond immediately to a reduction of power supply potential Vcc, control voltage VCOin does not change. Therefore, current Ia flowing to MOS transistor 73 does not change. Current Id flowing to MOS transistor 114 is reduced due to reduction in the gate voltage. Since current Ie flowing to MOS transistor 71 is the difference between Ia and Id (Ie=Ia-Id), reduction in power supply potential Vcc causes increase in current Ie flowing to MOS transistor 71. Since current Ie is mirrored by delay time variable elements 80.1–80.K, current Ie flowing to delay time variable elements 80.1–80K will increase. Therefore, the delay time of voltage control delay circuit 110 at the reduction of power supply potential Vcc is further reduced in comparison with that of a conventional voltage control delay circuit 35. Therefore, the entire delay time period of a DLL circuit does not change even when the delay time periods of clock buffers 31 and 36 is increased due to reduction of power supply potential Vcc.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A voltage control type delay circuit for delaying an input signal by a time period according to a control voltage and providing the delayed signal, said voltage control type delay circuit comprising:

a first transistor connected in series between a node and a first power supply potential line, for receiving said control voltage for conducting a current of a value according to the control voltage, a second transistor connected in series between said node and a second power supply potential line, a current control circuit connected to said node for increasing or decreasing a current flowing to said second transistor by a value according to a change in a power supply voltage, and a delay circuit for delaying said input signal by a time period according to said current flowing to said second transistor and providing the delayed signal, wherein said current control circuit comprises:

a third transistor connected in parallel with said first transistor for distributing a current flowing to said second transistor, and a voltage-down circuit for down-converting said power supply voltage and supplying the down-converted voltage to said third transistor.

2. The voltage control type delay circuit according to claim 1, wherein said voltage-down circuit comprises:

a first voltage divider resistor connected between an input electrode of said third transistor and said second power supply potential line, and a second voltage divider resistor connected between the input electrode of said third transistor and said first power supply potential line.

3. The voltage control type delay circuit according to claim 2, wherein said delay circuit comprises a plurality of delay time variable elements connected in series, each having a delay time period varied according to the current flowing to said second transistor.

4. A voltage control type delay circuit for delaying an input signal by a time period according to a control voltage and providing the delayed signal, said voltage control type delay circuit comprising:

a first transistor connected in series between a node and a first power supply potential line, for receiving said control voltage for conducting a current of a value according to the control voltage, a second transistor connected in series between said node and a second power supply potential line, a current control circuit connected to said node for increasing or decreasing a current flowing to said second transistor by a value according to a change in a power supply voltage, and a delay circuit for delaying said input signal by a time period according to said current flowing to said second transistor and providing the delayed signal, wherein said current control circuit comprises:

a third transistor connected in parallel with said second transistor for distributing a current flowing to said first transistor, and a voltage-down circuit for down-converting said power supply voltage and supplying the down-converted voltage to said third transistor.

5. The voltage control type delay circuit according to claim 4, wherein said voltage-down circuit comprises:

a first voltage divider resistor connected between an input electrode of said third transistor and said second power supply potential line and a second voltage divider resistor connected between the input electrode of said third transistor and said first power supply potential line.

6. The voltage control type delay circuit according to claim 5, wherein said delay circuit comprises a plurality of delay time variable elements connected in series, each having a delay time period varied according to said current flowing to said second transistor.

7. A voltage control type delay circuit for delaying an input signal by a time period according to a control voltage and providing the delayed signal, said voltage control type delay circuit comprising:

a first conductivity type first transistor connected between a first node and a ground potential line, for receiving said control voltage for conducting a current of a value corresponding to said control voltage;

a second conductivity type second transistor connected between said first node and a power supply potential line, having its input electrode connected to said first node;

a second conductivity type third transistor connected between a second node and said power supply potential line, and having its input electrode connected to said first node;

a first conductivity type fourth transistor connected between said second node and said ground potential line, and having its input electrode connected to said second node;

a current control circuit connected to said first node for increasing or decreasing current flowing to said second transistor by a value according to a change in a power supply voltage; and a delay circuit including a plurality of delay time variable elements connected in series for delaying said input signal by a time period according to current flowing to said third and fourth transistors and providing the delayed signal, wherein said current control circuit comprises a first conductivity type fifth transistor connected between said first node and said ground potential line, and a voltage-down circuit for down-converting said power supply voltage and supplying the down-converted voltage to said fifth transistor.

8. The voltage control type delay circuit according to claim 7, wherein said voltage-down circuit comprises a first voltage divider resistor connected between an input electrode of said fifth transistor and said power supply potential line, and a second voltage divider resistor connected between the input electrode of said fifth transistor and said ground potential line.

9. The voltage control type delay circuit according to claim 8, wherein each of said plurality of delay time variable elements of said delay circuit comprises an input node for receiving said input signal from a delay time variable element of a preceding stage, an output node for providing said input signal to a delay time variable element of a succeeding stage, first conductivity type sixth and seventh transistors connected in series between said output node and said ground potential line, having one input electrode connected to said input node and another input electrode connected to said second node, and second conductivity type eighth and ninth transistors connected in series between said output node and said power supply potential line, having one input electrode connected to said input node and another input electrode connected to said first node.

10. A voltage control type delay circuit for delaying an input signal by a time period according to a control voltage and providing the delayed signal, said voltage control type delay circuit comprising:

a first conductivity type first transistor connected between a first node and a ground potential line, for receiving said control voltage for conducting a current of a value corresponding to said control voltage;

a second conductivity type second transistor connected between said first node and a power supply potential line, having its input electrode connected to said first node;

a second conductivity type third transistor connected between a second node and said power supply potential line, and having its input electrode connected to said first node;

a first conductivity type fourth transistor connected between said second node and said ground potential line, and having its input electrode connected to said second node;

a current control circuit connected to said first node for increasing or decreasing current flowing to said second transistor by a value according to a change in a power supply voltage; and a delay circuit including a plurality of delay time variable elements connected in series for delaying said input signal by a time period according to current flowing to said third and fourth transistors and providing the delayed signal, wherein said current control circuit comprises a second conductivity type fifth transistor connected between said first node and said power supply potential line, and a voltage-down circuit for down-converting said power supply voltage and supplying the down-converted voltage to said fifth transistor.

11. The voltage control type delay circuit according to claim 10, wherein said voltage-down circuit comprises:

a first voltage divider resistor connected between an input electrode of said fifth transistor and said power supply potential line, and a second voltage divider resistor connected between the input electrode of said fifth transistor and said ground potential line.

12. The voltage control type delay circuit according to claim 11, wherein each of said plurality of delay time variable elements of said delay circuit comprises an input node for receiving said input signal from a delay time variable element of a preceding stage, an output node for providing said input signal to a delay time variable element of a succeeding stage, first conductivity type sixth and seventh transistors connected in series between said output node and said ground potential line, having one input electrode connected to said input node and another input electrode connected to said second node, and second conductivity type eighth and ninth transistors connected in series between said output node and said power supply potential line, having one input electrode connected to said input node and another input electrode connected to said first node.

13. An internal clock generation circuit for generating an internal clock signal in synchronization with an external clock signal, said internal clock generation circuit comprising:

a control voltage generation circuit receiving said external clock signal and said internal clock signal for providing a control voltage according to a phase difference between said two clock signals, a first transistor receiving said control voltage for conducting a current of a value according to the control voltage, a second transistor connected in series with said first transistor, a current control circuit connected to a node between said first and second transistors for increasing or decreasing a current flowing to said second transistor by a value according to a change in a power supply voltage, and a delay circuit for delaying said external clock signal by a time period according to said current flowing to said second transistor and providing the delayed signal as said internal clock signal, wherein said current control circuit comprises:

a third transistor connected in parallel with said first transistor for distributing a current flowing to said second transistor, and a voltage-down circuit for down-converting said power supply voltage and supplying the down-converted voltage to said third transistor.

14. An internal clock generation circuit for generating an internal clock signal in synchronization with an external clock signal, said internal clock generation circuit comprising:

a control voltage generation circuit receiving said external clock signal and said internal clock signal for providing a control voltage according to a phase difference between said two clock signals, a first conductivity type first transistor connected between a first node and a ground potential line, receiving said control voltage for conducting a current of a value according to said control voltage, a second conductivity type second transistor connected between said first node and a power supply potential line, having its input electrode connected to said first node, a second conductivity type third transistor connected between a second node and said power supply potential line, having its input electrode connected to said first node, a first conductivity type fourth transistor connected between said second node and said ground potential line, having its input electrode connected to said second node, a current control circuit connected to said first node for increasing or decreasing a current flowing to said second transistor by a value according to a change in a power supply voltage, and a delay circuit including a plurality of delay time variable elements connected in series, for delaying said external clock signal by a time period according to said current flowing to said third and fourth transistors, and providing the delayed signal as said internal clock signal, wherein said current control circuit comprises a first conductivity type fifth transistor connected between said first node and said ground potential line, and a voltage-down circuit for down-converting said power supply voltage and supplying the down-converted voltage to said fifth transistor.

15. A synchronous type semiconductor memory device generating an internal clock signal to operate in synchronization with an external clock signal, comprising:

a memory array including a plurality of memory cells arranged in a matrix;

a control voltage generation circuit receiving said external clock signal and said internal clock signal for providing a control voltage according to a phase difference between said two clock signals;

a first transistor receiving said control voltage for conducting a current of a value according to the control voltage;

a second transistor connected in series with said first transistor;

a current control circuit connected to a node between said first and second transistors for increasing or decreasing a current flowing to said second transistor by a value according to a change in a power supply voltage;

a delay circuit for delaying said external clock signal by a time period according to said current flowing to said second transistor and providing the delayed signal as said internal clock signal; and a data input/output circuit for inputting and outputting data signals in synchronization with said internal clock signal between selected memory cells of said memory array and an external output, wherein said current control circuit comprises:

a third transistor connected in parallel with said first transistor for distributing a current flowing to said second transistor, and a voltage-down circuit for down-converting said power supply voltage and supplying the down-converted voltage to said third transistor.

16. A synchronous type semiconductor memory device generating an internal clock signal to operate in synchronization with an external clock signal, comprising:

a memory array including a plurality of memory cells arranged in a matrix;

a control voltage generation circuit receiving said external clock signal and said internal clock signal for providing a control voltage according to a phase difference between said two clock signals;

a first conductivity type first transistor connected between a first node and a ground potential line, receiving said control voltage for conducting a current of a value according to said control voltage;

a second conductivity type second transistor connected between said first node and a power supply potential line, having its input electrode connected to said first node;

a second conductivity type third transistor connected between a second node and said power supply potential line, having its input electrode connected to said first node;

a first conductivity type fourth transistor connected between said second node and said ground potential line, having its input electrode connected to said second node;

a current control circuit connected to said first node for increasing or decreasing a current flowing to said second transistor by a value according to a change in said power supply voltage;

a delay circuit including a plurality of delay time variable elements connected in series, for delaying said external clock signal by a time period according to said current flowing to said third and fourth transistors, and providing the delayed signal as said internal clock signal; and a data input/output circuit for inputting and outputting data signals in synchronization with said internal clock signal between selected memory cells of said memory array and an external output, wherein said current control circuit comprises a first conductivity type fifth transistor connected between said first node and said ground potential line, and a first voltage-down circuit for down-converting said power supply voltage and supplying the down-converted voltage to said fifth transistor.

* * * * *